United States Patent

Sinai et al.

Patent Number: 6,122,197
Date of Patent: Sep. 19, 2000

[54] ARCHITECTURE AND METHOD FOR PERFORMING PAGE WRITE/VERIFY IN A FLASH MEMORY CHIP

[75] Inventors: Keyhan Sinai, Santa Clara; Paul Jei-Zen Song, Sunnyvale, both of Calif.

[73] Assignee: ISSI/NexFlash Technologies, Inc., Santa Clara, Calif.

[21] Appl. No.: 09/108,759

[22] Filed: Jul. 1, 1998

[51] Int. Cl.[7] .................................................. G11C 16/06
[52] U.S. Cl. ............... 365/185.22; 365/154; 365/185.08; 365/230.05
[58] Field of Search ......................... 365/185.22, 185.08, 365/154, 230.05, 185.2, 189.07

[56] References Cited

U.S. PATENT DOCUMENTS

| | | | |
|---|---|---|---|
| 5,590,073 | 12/1996 | Arakawa et al. | 365/185.08 |
| 5,812,451 | 9/1998 | Iwata | 365/185.11 |
| 5,835,414 | 11/1998 | Hung et al. | 365/185.25 |

*Primary Examiner*—David Nelms
*Assistant Examiner*—Hoai V. Ho
*Attorney, Agent, or Firm*—Pennie & Edmonds LLP

[57] ABSTRACT

A semiconductor non-volatile memory device is disclosed which is based on the use of Fowler-Nordheim electron tunneling to charge and discharge the isolated gates of the storage cells. The disclosed memory device includes circuitry capable of verifying the threshold level of written storage cells and rewriting only those cells whose threshold is outside a desired threshold range. The disclosed circuit has the further advantage of being able to load data words and verify cell contents simultaneously by utilizing both ends of the bit lines.

26 Claims, 6 Drawing Sheets

ARCHITECTURE AND METHOD FOR PERFORMING PAGE WRITE/VERIFY IN A FLASH MEMORY CHIP

The present invention relates generally to non-volatile random access semiconductor memory devices wherein data can be written and erased by electrical means and, more particularly, to a non-volatile semiconductor memory device having circuitry to enable simultaneous data writing and verification.

BACKGROUND OF THE INVENTION

The structure and functionality of non-volatile random access semiconductor memory devices has evolved in the last decade in order to match the specific needs and requirements of data storage and processing. Non-volatile memory devices are useful in many applications whenever data must be retained after devices are. powered off. Upon restart of many computing or entertainment devices, initialization data must be available to enable a processor to load its programs and operating systems from peripheral storage such as hard disks or optical compact disks. Desirable features of non-volatile semiconductor memory devices include large capacity, high speed of writing, high speed of readout, repeated erasability, ease of writing and erasing of data as well as specific practical features that may allow for example reading or writing to specific sectors within the memory while protecting other sectors.

An early example of erasable non volatile memory is the Erasable Programmable Read Only Memory or EPROM. EPROM devices comprise a multiplicity of memory cells generally arranged in arrays of several thousand cells on the surface of a semiconductor chip, each cell comprising one or more metal oxide semiconductor (MOS) transistors. Each MOS transistor has a first control gate that consists of a metallic area separated from the drain or depletion area of the transistor by a thin oxide film and a second electrically insulated gate located between the control gate and the drain. Such cells retain the data in the form of stored electrical charge on the insulated gate. In order to erase an EPROM electrons generated by ultraviolet radiation from a special erase lamp are utilized. Such devices necessarily require the erasing of all sectors of the memory followed by a re-write of the new data to all sectors of the memory. The rewrite operation consists of injecting hot electrons into the floating gate. Such write-erase processes can be time consuming and subject to error generation especially if only small sections of the data stored need to be modified. An EPROM generally requires a high-voltage supply with substantial current-generating capability to generate the hot electrons. Furthermore, the process of generating hot electrons degrades the transistor gate regions, which limits the number of erase-write cycles that can be performed.

A more recent type of memory device, called EEPROM or electrically erasable PROM, utilizes tunneling electrons generated by the application of a high voltage difference between a control gate located above the insulated gate and the drain region of the MOS transistor, to pump charge into or out of the insulated gate. An EEPROM is distinguished from an EPROM by two features:

1) the program and erase operations can be accomplished on a byte-by-byte basis, whereas, in an EPROM, the erase operation is global and only the program operation is byte-by-byte; and 2) the mechanism underlying the program and erase operations in an EEPROM is Fowler-Nordheim (FN) tunneling, whereas, in an EPROM, it is hot-electron injection for programming (typically a high-current mechanism), and UV-erase for the erase operation.

Flash EPROMs, which have become the standard non-volatile memory are hybrid devices, share features of the EPROM and EEPROMS. That is, similarly to EPROMS, flash memories have a global (or sector, in more recent types) erase mode. Similarly to EEPROMS, flash memories can be erased and programmed electrically. The characteristics of the different types of non-volatile memory are summarized in Table 1. The present invention is implemented in a flash EPROM with tunneling program and sector tunneling erase. The basic operation of a Fowler-Nordheim flash EPROM is now described in reference to FIG. 1.

TABLE 1

| Memory Type | Program Mechanism | Erase Mechanism |
| --- | --- | --- |
| EPROM | hot-electron (high current) | global (non-byte) UV |
| EEPROM | FN-tunneling (low current) | FN-tunneling (byte operation) electrical |
| Flash EPROM | hot-electron or tunneling injection | FN-tunneling global or semi-global (non-byte) electrical operation |

Figure 1:
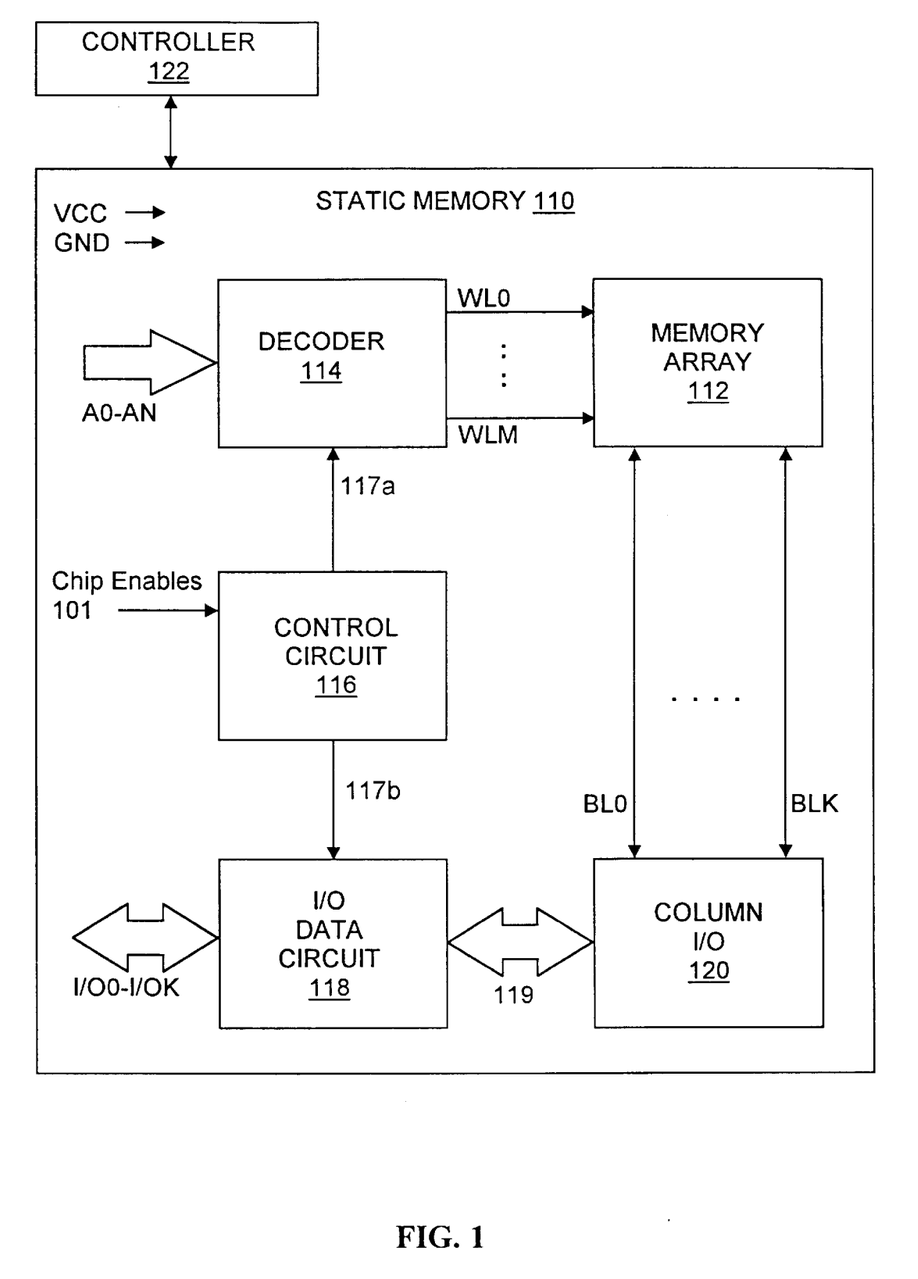
FIG. 1 is a block diagram of a typical flash memory.

Referring to FIG. 1, there is shown a block diagram of a flash memory 110. This block diagram is also representative of the architecture of other types of memories. The flash memory 110 includes a memory array 112, an address decoder 114, a control circuit 116, an input/output (I/O) data circuit 118 and a column I/O circuitry 120. The memory 110 operates in response to external signals provided by a controlling device 122, such as a microprocessor.

The principle of operation of flash memories, such as the memory 110, is well known and therefore is only briefly described herein. The controller 122 initiates a memory operation by asserting a chip enable signal 101 and supplying address signals A0–AN (corresponding to 2N+1 memory locations) designating the address of a memory location where the operation is to be performed. If the memory operation is a write operation, the controller 122 supplies the data to be written to the addressed memory location via the bidirectional input output lines I/O0–I/Ok (corresponding to k+1 bit memory words). If the memory operation is a read operation, the stored information from the addressed location is read out from the same bidirectional input output lines I/O0–I/Ok. The memory 110 also provides connections for external power supply (Vcc) and ground (GND) signals.

The heart of the memory 110 is the memory array 112, which consists of flash memory cells, each capable of storing one bit of data, arranged in rows and columns. In the conventional manner, all of the cells in one row are energized for a memory operation (either a read or a write) by a word line WL uniquely associated with that row. A memory operation cannot be performed unless the word line associated with the target row of cells is activated.

At least a subset of the cells in a row (typically all of the cells that store data for one memory word) can be accessed simultaneously for a given memory operation via the bit lines BL. When the memory operation is a read, the bit lines BL are coupled to sense amplifiers in the column I/O 120 that "sense" the data stored in the corresponding cells of the row whose word line WL is active. When the memory operation is a write operation the bit lines BL carry the signals used to program the corresponding cells of the row associated with the active word line.

The control circuitry 116 controls the other blocks of the memory 110 in accordance with the chip enables 101. Depending on the operation to be performed, the control circuitry issues the appropriate control signals 117a, 117b to the decoder 114 and the I/O data circuit, respectively.

Regardless of whether the memory operation is a write or a read, the decoder 114 decodes the address signals A0–AN and activates the word line WL of the row that includes the memory word that is the target of the current memory operation. If the operation is a write, the I/O data circuitry 118 buffers the input data signals I/O0–I/Ok and outputs the buffered data to the column I/O 120 via the bidirectional data bus 119. The column I/O 120 then latches the input signals in parallel onto the corresponding bit lines BL–BLK The signals on the bit lines BL0–BLK are used to program the cells composing the word whose word line was activated for the current operation by the decoder 114.

If the operation is a read, sense amplifiers in the column I/O 120 sense the signals on the respective bit lines BL, convert the sensed signals into binary (e.g., high or low) voltages that represent the programmed state of the addressed word and output the word's bit values to the I/O data circuit via the bi-directional bus 119. The output data are buffered by the I/O data circuit 118 and latched onto the bi-directional data lines I/O0–I/Ok for use by the controller 122.

The operation so far described is typical of most memories. For the sake of clarity the physical writing process is now more specifically described in reference to Table 2.

Table 2 shows the voltages applied to the gate (Vg), drain (Vd), source (Vs) and bulk (Vb) of a MOS transistor constituting a storage cell for read, write and erase operations. In the write and erase modes, the indicated voltages affect the cell's threshold voltage Vt as shown (e.g., low or high), where Vt is defined as the voltage that must be applied across the gate and source of a storage cell to make it conduct during a sense or read operation. In the preferred embodiment, the voltages Vpp, Vpn and Vcc are 10V, −10 V and 3.0 V, respectively. As for other terms used in Table 2, "floating" means the voltage is allowed to take on any value under the applied conditions and Vcc+ is a voltage larger than Vcc.

TABLE 2

|  | Vg | Vd | Vs | Vb | Vt |
| --- | --- | --- | --- | --- | --- |
| READ | Vcc | 1–1.2 V | 0 V | 0 V | unchanged |
| WRITE | Vpn | Vcc+ | floating | 0 | low |
| ERASE | Vpp | floating | Vpn | Vpn | high |

In a write operation the high negative voltage Vpn applied to a cell's control gate encourages positive charges to tunnel to the cell's insulated gate. This decreases the cell's Vt (hence the low Vt) because the stored positive charge supplements the gate voltage applied during a subsequent read operation performed on that cell.

Conversely, in an erase operation the high positive voltage Vpp applied to a cell's control gate encourages negative charges to tunnel to the cell's insulated gate. This increases the cell's Vt (hence the low Vt) because the stored negative charge counteracts the gate voltage applied during a subsequent read operation performed on that cell.

Because of manufacturing-induced variations between cells, applying the voltages prescribed in Table 2 during a write operation results in different values of Vt for different cells. As a consequence the required voltage Vt to sense the data stored in a particular cell will vary from cell to cell. Such variations must be contained within acceptable limits in order to assure the proper operation of the storage device, especially in cases where a low Vcc circuit is used. For example, if Vcc=2.5 V and the variance in Vt is 0.6 volts (possibly resulting in a Vt that is higher than the Vcc level coupled to the gate during a read operation) it is not possible to achieve reliable operation of the memory device. Therefore, it is imperative to verify that the Vt of all of the written cells is within an optimal range for the operating environment.

A general verification method employed in the prior art is to repeat the writing process several times to ensure that the Vt is low enough. This repeated writing is applied to all cells regardless of whether the Vt is already low enough after the first write. Such repeated writing stresses the oxide layer that constitutes the insulation between the gate and bulk and shortens the useful life of the storage device. Another disadvantage of the prior art is that over-writing a cell lowers Vt to such a low value that current leakage starts occurring between the cell's source and drain even when there is no memory activity. When leakage occurs a healing step must be further applied to bring back Vt to an acceptable level. Such a healing step requires additional circuitry and adds complexity to the writing process.

Accordingly, several objectives the present invention include: providing a method of achieving a controllable Vt at each storage cell, preventing over-stressing of the oxide insulating layer and allowing the active verification of the written data while simultaneously loading new data.

SUMMARY OF THE INVENTION

In summary, the present invention teaches a circuit for a flash type memory device based on Fowler-Nordheim tunneling and a method of verifying the writing of data bits into the cells of this flash type memory device by sensing the Vt of the cells and comparing them with the corresponding input data bits. If the written data words and the input data words are identical, the writing process is considered to be successful and the system proceeds to write the next data row. If a sensed data bit in a given row is different from the corresponding input data bit, the write procedure is repeated only for that particular bit. A special bit line latch circuit is utilized which is loaded initially with data from an external source or (in a second embodiment) from an SRAM cell. After the high-voltage page write operation, sensed cell outputs are fed back to a processing circuit that compares them with the corresponding data inputs held in the bit latch itself or (in a second embodiment) to data held in a static RAM (SRAM) array and reloads a logical 1 into the latch corresponding to the bit line of a successfully written cell. The two embodiments differ in the presence of the SRAM. In one case (FIG. 2), the processing unit compares data from the SRAM to data from the sense-amp. In the other case (FIG. 3), the processing unit compares data from the bit-latch to data from the sense amp. In both cases data in the bit latch is reset to a '1' in case of success. The presence of an SRAM adds to the flexibility of in-system operation where data stored in the SRAM could be used to write other blocks of memory. The bit latch in the two embodiments also differs in that, in the implementation without an SRAM, a second output signal is attached to the y-select circuitry through a switch activated by the program verify signal PV. The disclosed memory device includes two column select circuits, one at each end of the bit lines. The first column select circuit allows for loading data into the latches corresponding to the bit lines while the second column select circuit allows the sensing of the data cells. The loading and sensing operations can be carried out simultaneously. In addition to the comparator unit, the processing unit also has a summation circuit which generates the flag indicating whether the write operation was a failure or success.

BRIEF DESCRIPTION OF THE DRAWINGS

Additional objects and features of the invention will be more readily apparent from the following detailed description and appended claims when taken in conjunction with the drawings, in which:

DESCRIPTION OF THE INVENTION

Figure 2:
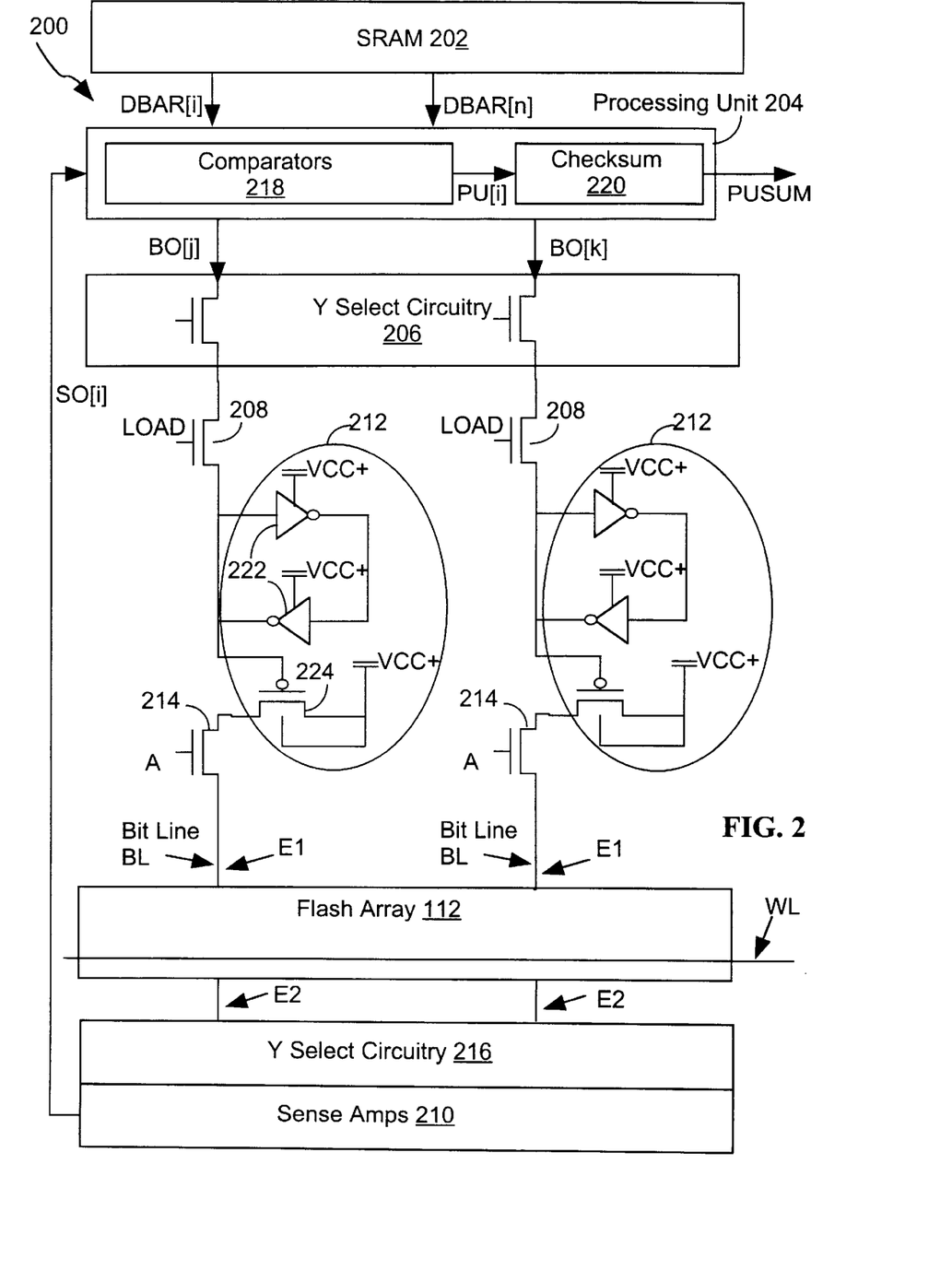
FIG. 2 is a circuit diagram showing a preferred embodiment with the bit line latch circuitry, two column select circuits and an SRAM. (In this case, data from the SRAM is compared to the data from sense amp, and the bit latch is reset to a '1' if successful.)

Referring to FIG. 2, there is shown a circuit diagram of an embodiment 200 of the present invention that can be utilized within the column I/O circuit 120 of FIG. 1. The embodiment 200 includes a static RAM (SRAM) 202, a processing unit 204, a first Y-select multiplexer 206, load switches 208, bit latches 212, auxiliary switches 214, a second Y-select multiplexer 216 and sense amplifiers 210. A preferred embodiment of the processing unit 204 includes comparator circuitry 218 and checksum circuitry 220. A preferred embodiment of a bit latch 212 includes two inverters 222 and a p-channel output gate 224. This circuitry is operable in write, erase and read modes. However, as the present invention is directed to write/verify circuitry, the discussion herein of the embodiment 200 will focus on its write mode operations.

The SRAM 202 stores the data to be written into the flash memory array 112 (shown in FIG. 1). The outputs DBAR[i] of individual SRAM cells, which represent the inverse of the data to be written to a flash cell, are connected to the data processing unit 204. The processing unit 204 also receives a set of outputs SO from the sense amplifier array 210 that represent the sensed data from a subset of the flash cells in the array 112 and a control signal PV, which is generated by the control circuit 116 (FIG. 1). The processing unit 204 generates a set of output signals BO, each of which is a function of respective DBAR and SO signals. The function used to generate the DBAR and SO signals is determined by the value of the PV signal. The output signals BO are coupled by the first Y-select multiplexer 206 to one end E1 of a subset of the bit lines BL via the load switches 208, bit latches 212 and auxiliary switches 214. The subset of the bit lines is selected by a column sequencer (not shown) that is part of the decoder circuit 114 of FIG. 1. The processing unit 204 also generates an output PUSUM, which is a pass/fail flag to the on-chip write controller indicating whether or not another write cycle is needed.

Each load switch 208 is responsive to a common LOAD control signal and each auxiliary switch 214 is responsive to a common auxiliary control signal A. Between the switches 208 and 214 is the bit latch 212, which, during a write operation, latches the value that appears at the source of the load switch 208. The latched value is converted to a high or low voltage on a corresponding bit line BL and flash cell in the array 112 only when the auxiliary control signal A is asserted. Being able to individually control the switches 208, 214, the present invention can independently perform data load and write/verify operations.

In the preferred embodiment, the bit latch includes the two inverters 222 and the output gate 224. The two inverters 222 are connected end to end, in the conventional manner. However, the pull-up of each inverter is tied to the Vcc+ node. In the initial load operation, positive values at the source of the load switch 208 are latched at the Vcc level. During the high-voltage write mode, the Vcc+ node rises from Vcc to Vcc+, and the latched value is coupled to the gate of the pass transistor 224, whose source, drain and body are respectively coupled to the Vcc+ node, the drain of the switch 214 and the Vcc+ node. When the latched value is at the Vcc+ level the gate 224 is completely off and, as a result, the value of a selected bit line BL (i.e., the source of a selected switch 214) either floats or is grounded. When the latched value is at the GND level, the gate 224 passes a Vcc+ voltage to the switch 214. In this situation, when a respective signal A is asserted the corresponding bit line goes to the smaller of Vcc+ or (VA−Vt) (where VA is the voltage of the signal A and Vt is the threshold voltage of the transistor 214). Preferably, VA is set so that the bit line goes to Vcc+.

The other ends E2 of the bit lines BL are coupled to the second Y-select multiplexer 216, which connects the same subset of the bit lines BL selected by the column sequencer to the array of sense amplifiers 210. As mentioned above, the sense amplifier outputs SO are fed back to the processing unit 204. A write/verify operation as performed by the present invention is now described in reference to the circuitry of FIG. 2.

Each write/verify operation consists of three steps. In the first step (i.e., a load cycle), the bit latches 212 are loaded sequentially with the data D[i] from the SRAM 202 via the Y-select multiplexer 206 and the load switch 208. This step is enabled by: (1) setting the control signal PV to a first value (0 in the preferred embodiment) that causes the processing unit 204 to transfer the D[i] values to the Y-select circuit 206 without processing and (2) asserting the LOAD signal, which activates the load switch 208. After data has been latched to the bit latch, the LOAD signal is deasserted.

In the second step (i.e., a high-voltage operation), the auxiliary switch 214 is turned on by asserting the auxiliary control signal A, which couples the latched data to the bit lines BL. At approximately the same time, the word line WL of a selected row of memory is taken to the high negative voltage Vpn to induce tunneling. In this embodiment, when A is asserted, if the content of the bit latch is a '0', then the bit line of the written cell becomes high (e.g., at Vcc+), and the resulting voltages on the gate, drain and source of the cell cause positive charges to be stored on the cell's floating gate. For bit latches containing a '1', the bit line of the corresponding column becomes floating or grounded. Thus, stored 0's in the SRAM (whose correspond DBAR values are high signals) translate to written cells in the array 112, while stored '1's do not shift the cells' threshold voltages.

In the third step (i.e., program verify), the switch 214 is closed, isolating the latches 212 from the bit lines BL while the LOAD signal is reasserted and switch 208 is conducting, and the sense amplifiers 210 are connected to the selected bit lines BL through the Y-select circuit 216. The outputs SO[i] of the sense amplifiers 210 are coupled to the processing circuit 204, which compares the SO[i] signals to the contents DBAR[i] of the SRAM 202. In the preferred embodiment, this mode of processor operation is enabled by setting the control signal PV to 1 (compare to step 1, where setting the PV signal to 0 causes the processing unit 204 to simply transfer the SRAM output DBAR to the Y-select circuitry 206). If any bit line sensed output SO[i] does not match the corresponding input data D[i] from the SRAM 202, the processing unit 204 outputs a low (e.g., 0 V) BO[i] signal to the corresponding latch circuit 212 via the Y-select circuit 206 and the second through third steps are repeated. This iterative process is stopped only when all of the sense amplifier outputs SO[i] match the corresponding data inputs DBAR[i].

In the preferred embodiment, the processing unit's comparator circuitry 218 compares the SO[i] and D[i] values and generates a signal PU[i] indicating whether the comparison was a match or a mismatch. The checksum circuity 220 receives the PU[i] values for all the bits of a word being programmed and generates the PUSUM output that indicates whether the program operation was successful or not. Preferred embodiments of the comparator circuitry 218 and the checksum circuitry 220 are described in reference to FIGS. 4 and 5.

Figure 3:
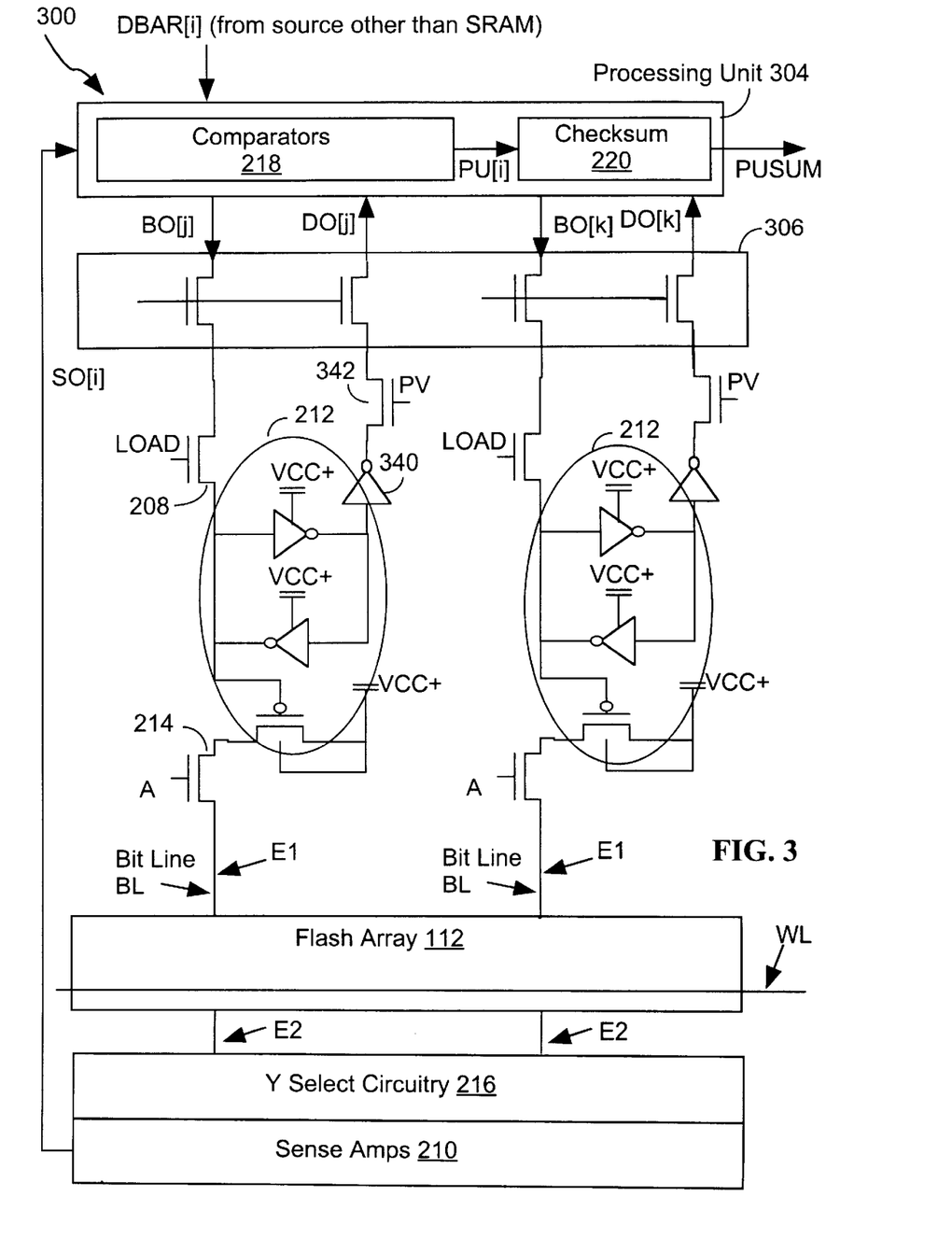
FIG. 3 is a circuit diagram showing a second embodiment with the bit line latch circuitry, two column select circuits and no SRAM. (In this case, data from the bit latch itself is compared to data from sense amp and reset to a '1' if successful.)

Referring to FIG. 3, there is shown an embodiment 300 of the present invention that does not include an SRAM 202. This embodiment has many elements the same as or similar to those of the embodiment 200, including a processing unit 304, a first Y-select multiplexer 306, load switches 208, bit latches 212, auxiliary switches 214, a second Y-select multiplexer 216 and sense amplifiers 210 (different numbers indicate elements that are different from similar elements of FIG. 2). Additional elements include an inverter 332 and a switch transistor 334 that couple the output DO[i] of a bit latch 212 to the first Y-select multiplexer 306.

Differences from similar components of the embodiment 200 include:
the first Y-select multiplexer 306 includes two switches for each bit line: one 306a that couples the BO[i] signals to the load switch 208 and another 306b that couples the bit latch output DO[i] to the processing unit 304; and
the processing unit 304 compares the outputs DO[i] to the sense outputs SO[i] instead of the SRAM outputs DBAR[i] to the sense outputs SO[i] (otherwise the processing units 204 and 304 are identical).

Because the SRAM 202 is not present, in the embodiment 300 data is initially loaded from an external source to the bit latches 212 through the processing unit 304. Step 2 for this embodiment is identical to step 2 for the embodiment 200, described above. In step 3, the data in the bit latch 212 is inverted by the inverter 340 and the inverted value is output through the switch 342 when the PV control signal is high. The output DO[i] of the switch 342 is output to the processing unit 304, where it is compared to the corresponding SO[i] value by the comparator circuitry 218, as described above. The comparator circuitry 218 outputs BO[i] and PU[i] signals as described above, except the BO[i] and PU[i] values reflects the result of comparing DO[i] and SO[i] values. The checksum circuitry 220 computes the PUSUM [i] signals as described above. If there is a mismatch between the DO[i] and SO[i] signals the processing unit 304 outputs a low (e.g., 0V) BO[i] value, and the steps 2 through 3 are repeated. If there is a match, the bit latch 212 is reset to a '1' and the process stops. In both embodiments 200 and 300, another write/verify iteration results when the PUSUM signal is at a '1' (i.e., fail). The iterative process stops when PUSUM is at a '0' (i.e., pass).

Figure 7:
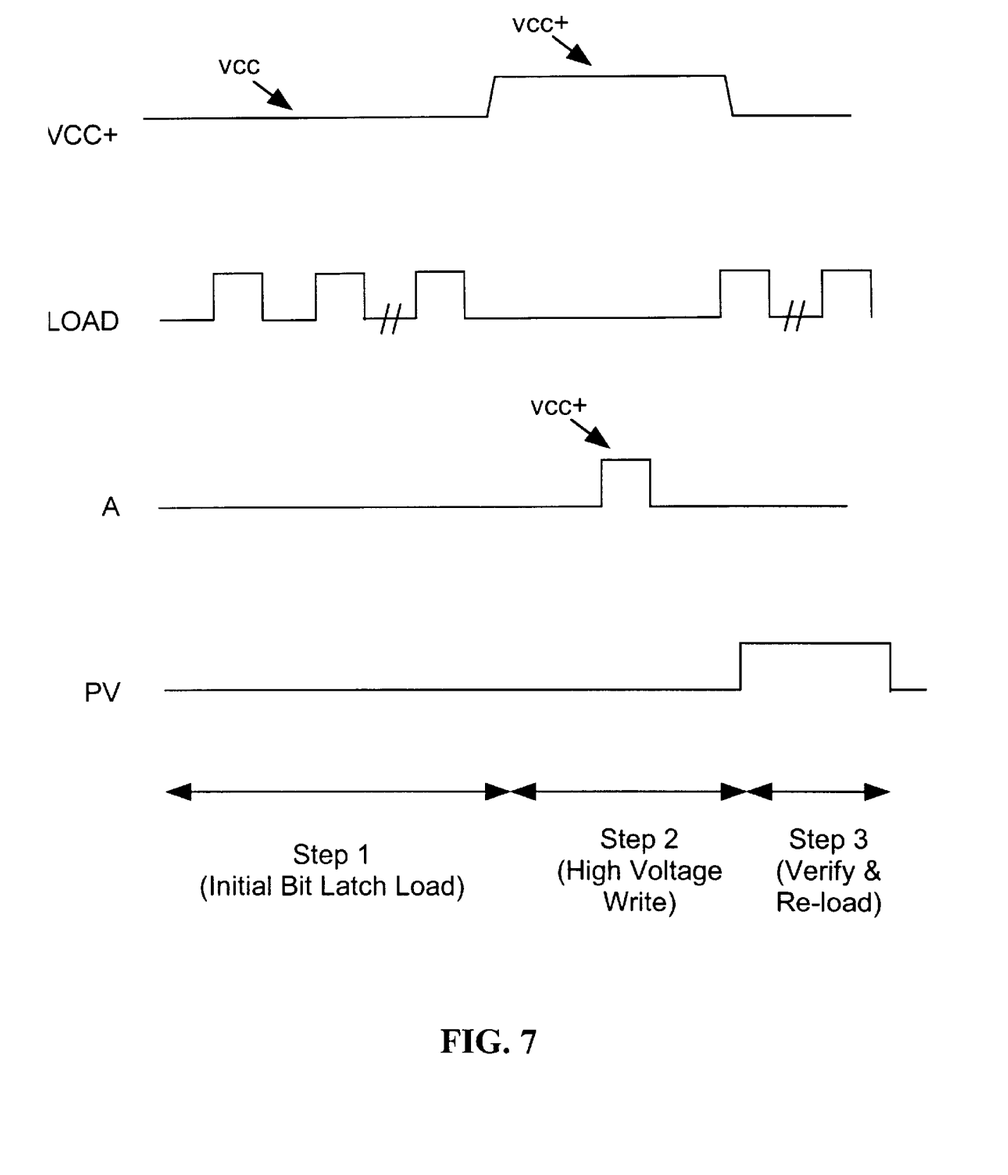
FIG. 7 is a timing diagram for steps required in the page write/verify method.

Referring to FIG. 7, there is shown a timing diagram for steps 1 through 3 that is common to both embodiments 200 and 300. This timing diagram shows the voltage levels of the Vcc+, LOAD, A and PV signals. Note that the A signal goes to (Vcc+)+Vt during the write operation (step 2). This is required so that the bit line is at a full Vcc level for the write operation. This is not required for the other steps. Note: the bit line BL is only at Vcc+ for a bit-latch containing a '0'; if a bit-latch contains a '1'=Vcc at the loading step, the '1' Vcc goes to Vcc+ in the high-voltage step and the bit line is not driven by the bit latch.

Consequently, the present invention provides a method of achieving a controllable Vt at each storage cell while prevent over-stressing of the oxide insulating layer due to overwriting of correctly written cells. The present invention also allows the active verification of the written data while simultaneously loading new data due to the two switches 208 and 214. A preferred system configuration is now described in reference to FIG. 6.

Figure 4:
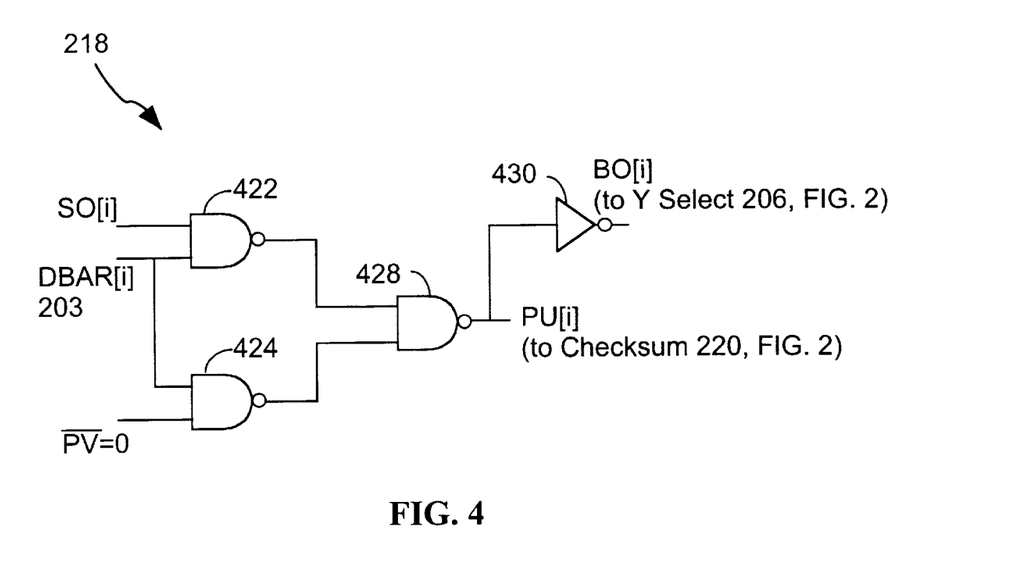
FIG. 4 is a circuit diagram showing a portion of the processing unit of FIGS. 2 and 3 used to process an ith sense amplifier output and an ith bit latch or SRAM output.
Figure 5:
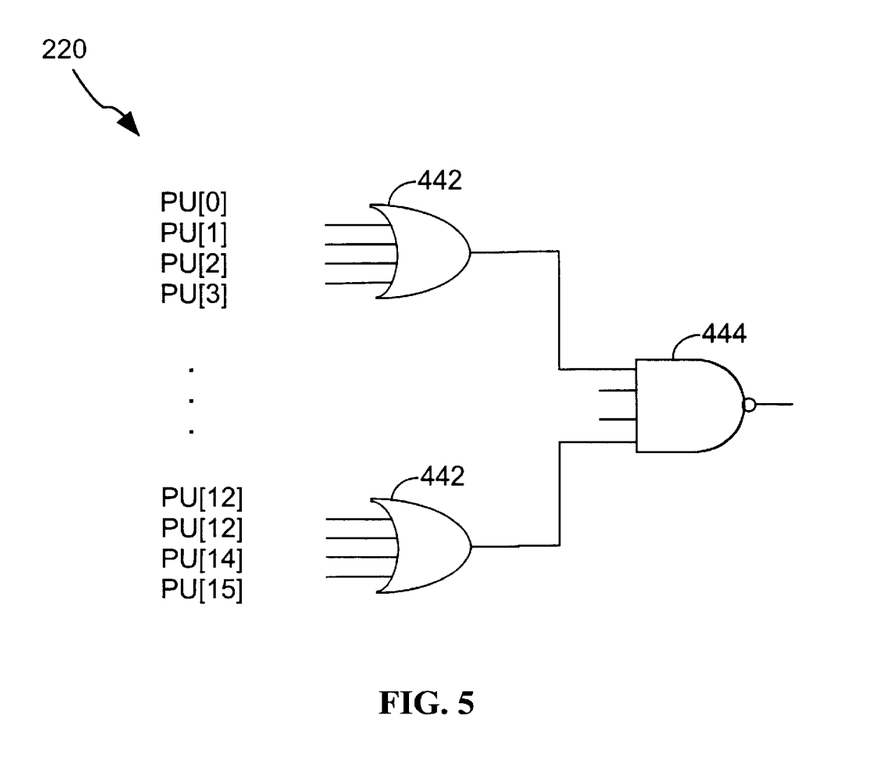
FIG. 5 is a circuit diagram of the checksum computation part of the processing unit of FIGS. 2 and 3.
Figure 6:
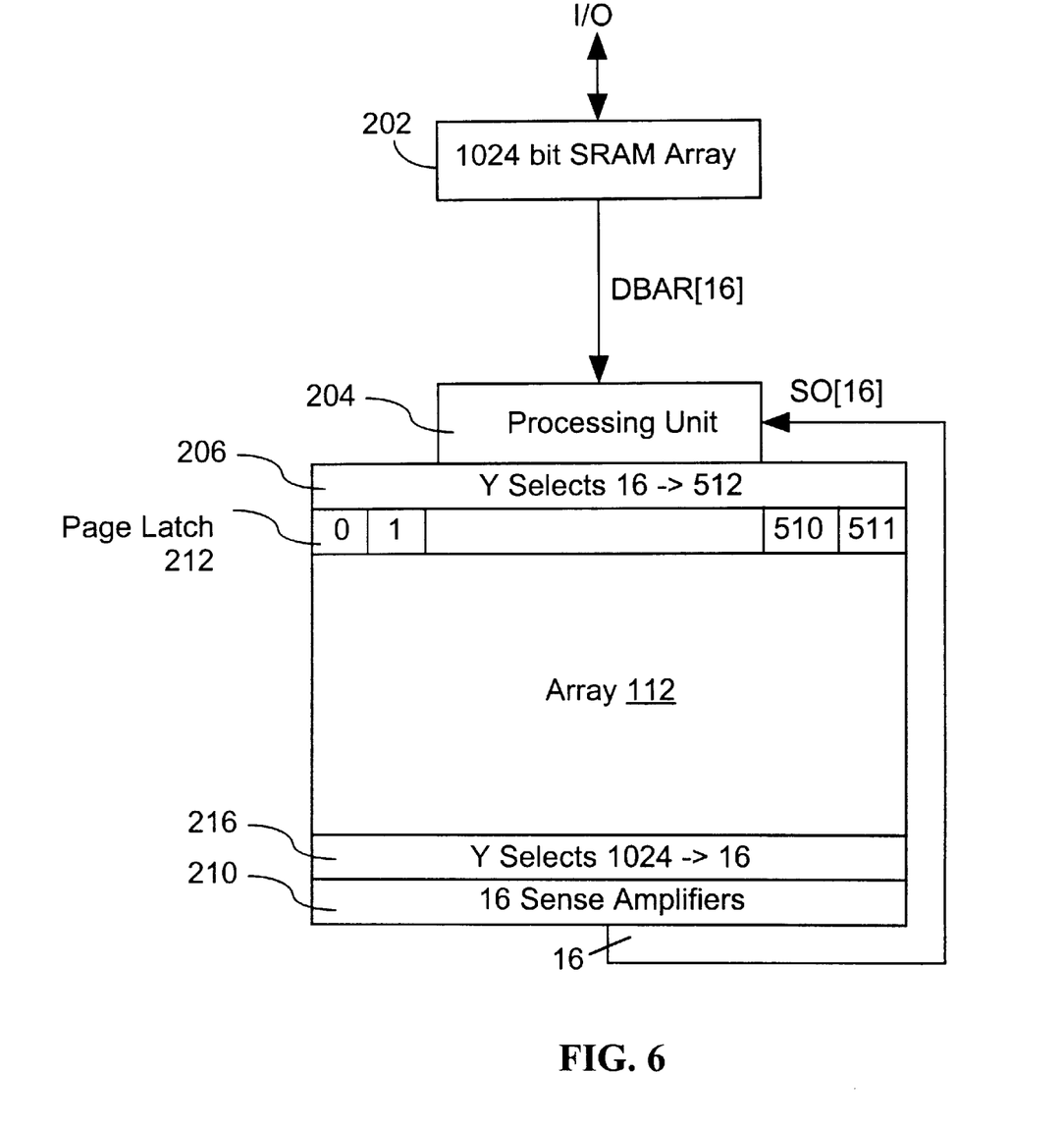
FIG. 6 is a data flow diagram of a preferred configuration of the present invention.

Referring to FIG. 6, there is shown a data and hardware diagram of a specific embodiment 400 of the present invention. Input and output of data to the memory device 400 is achieved through I/O lines to the SRAM unit 202, which includes storage for 1024 bits of data. Sixteen data lines 203 carrying the DBAR signals connect the SRAM 202 to the processing unit 204. The Y-select circuit 206 allows the connection of the 16 data lines 203 to ordered subsets of sixteen latches out of 512 latches 212. Each latch 212 is shared by two column bit lines BL. Thus, the circuit 400 has 1024 bit lines. Assuming that the array 112 has 1024 rows, the total number of cells addressable is 1024×1024=1048576 cells, or about one million cells. The second Y-select circuit 216 allows a sixteen line subset of the bit lines BL to be connected to sixteen sense amplifiers in the sense amplifier array 210. A preferred embodiment of the processing unit 204 compatible with the embodiment 400 is now described in reference to FIGS. 4 and 5. Referring to FIG. 4, there is shown a part 218*i* of the comparison circuit 218 (FIGS. 2, 3) that processes data for a single bit i, including a data signal DBAR[i] 203, a corresponding SO[i] sense amplifier signal and the PV control signal, which is common to all comparison circuits 218. Generally a multiplicity of data lines (e.g., 16 or 32 lines) are processed in parallel. The comparison circuit 218*i* includes first, second and third NAND gates 422, 424, 428 and a first inverter 430. The ith sense amplifier output SO[i] is coupled to the first input of the first NAND gate 422, and the ith data line DBAR[i] is coupled to the second input of the first NAND gate 422 and to the first input of the second NAND gate 424. The control signal PV is coupled to the second input of the second NAND gate 424. The outputs of the gates 422 and 424 are connected, respectively, to the two inputs of the third NAND gate 428. The output PU[i] of the third NAND gate 428 corresponds to the logical expression:

PU[i]=NOT D[I] AND [SO[i] OR (NOT PV)]

The PU[i] signal is coupled to the input of the inverter 430, whose output BO[i] is the inversion of PU[i]. According to the preceding PU[i] expression, the comparison circuit 218*i* compares the sensed output SO[i] of the ith sense amplifier to the corresponding data DBAR[i] stored in the SRAM and outputs a BO[i] signal with a value of one if the data D[i] (the complement of DBAR[i]) matches the sense amplifier output SO[i] and a value of zero otherwise. This comparison is only enabled when the PV signal is asserted. When the PV signal is set to zero, the processing unit simply transfers and inverts the DBAR[i] signal to the corresponding output signal BO[i]. It is now described in reference to FIG. 5 how the set of PU[i] signals are processed to determine whether the write/verify operation has been successful.

Referring to FIG. 5 there is shown a circuit diagram of a preferred embodiment of the combinational logic circuit 220 (FIGS. 2, 3) that generates a single PUSUM output that indicates whether the write/verify operation for a selected portion of a selected row of the array 112 has been successful. The circuit 220 includes four NOR gates 442 and a NAND gate 444. Each NOR gate 442 is coupled to four respective PU signals from a corresponding number of the circuits 218*i* (FIG. 4). The outputs of the NOR gates 442 are connected to the inputs of the NAND circuit 444. The output of the NAND circuit forms the PUSUM signal according to the following Boolean expression:

PUSUM=PU[0] OR PU[1] OR ... PU[14] OR PU[15]

This expression is true (i.e., PUSUM=1) when any of the inputs PU(i) is true. Consequently, the condition PUSUM=1 indicates the failure of one of the sense amplifiers outputs SO[i] to match the corresponding data input D[i]. The PUSUM signal is coupled to the memory controller 116, which, when this signal is true, reiterates the write process described herein. Note that this circuit is appropriate for embodiments where sixteen values are written at once. In embodiments where different numbers of cells are simultaneously written and verified, different numbers of NOR gates 442 would be required.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For example, the checksum operation employed to test the completion of a write operation may be carried out by a microprocessor unit instead of the circuit 220 of FIG. 5, allowing more flexibility in the number of iterations to be executed in a write process.

What is claimed is:

1. A write/verify circuit for use in a non-volatile, electrically erasable semiconductor memory device capable of operating in read, write and erase modes, the semiconductor memory having a plurality of non-volatile cells, each of which is characterized by a threshold Vt that takes first and second Vt values, respectively, when first and second data values are correctly stored in the non-volatile cell, the cells being arranged in columns, each controlled by a respective bit line, the write/verify circuit comprising:

a plurality of memory inputs, each configured to receive an input data value to be written into a respective one of the non-volatile cells;

a writing mechanism configured to write processor data values into at least a subset of the non-volatile cells having respective processor data values set to the first data value;

a plurality of sense amplifiers, each of the plurality of sense amplifiers being configured to read a stored data value in at least one of the non-volatile cells and each of the plurality of sense amplifiers having an output to output a corresponding output data value; and a processing unit coupled to the inputs, the writing mechanism and the sense amplifiers, the processing unit being configured to generate the processor data values set to the first data value for those cells whose respective input data value is set to the first data value and whose respective output data value is set to the second data value.

2. The write/verify circuit of claim 1, wherein the write mechanism comprises:

a plurality of bit latches, configured to latch the processor data values prior to their being written into the non-volatile cells, each bit latch having an output to output a respective one of the latched processor data values; and a plurality of bit line switches, having inputs coupled to the outputs of the bit latches, configured to pass latched outputs set to the first data value to the non-volatile cells upon assertion of a bit line control signal.

3. The write/verify circuit of claim 2, wherein the bit latch comprises:

first and second level-shifting inverters coupled end to end, each inverter having an input and an output, the input of the first inverter and the output of the second inverter being coupled to a respective processor data value input, each of the inverters being configured to invert a Vcc level processor data value to a ground level latched output and a GND level processor data value to a Vcc+level latched output, the first and second inverters generating a latched output; and an output switch with a gate and drain respectively coupled to the latched output and the input of the bit line switch and a source and body coupled to a Vcc+ node, such that the output switch outputs the Vcc+ level latched output to the bit line switch when the latched output is at the GND level and otherwise turns off.

4. The write/verify circuit of claim 3, wherein:

the bit line switch comprises an n-channel transistor with drain, gate and source coupled respectively to the source of the output switch, the bit line control signal an the input of the non-volatile cell; and the bit line control signal, when asserted, is set to at least the Vcc+ level.

5. The write/verify circuit of claim 2, wherein the processing unit includes a combination of not more than three NAND gates and an inverter for each of the sense amplifier outputs, each of the combinations being arranged to compute a logical expression: PU(i)=NOT D(i) AND (SO(i) OR (NOT PV)), wherein D(i) is the ith input data value, SO(i) is the ith sense amplifier output data value and PV is a logical control input, such that an ith processor data value is at least in part a function of PU(i).

6. The write/verify circuitry of claim 5, wherein the input D[i] is derived from a respective one of the latched outputs.

7. The write/verify circuit of claim 1, further comprising a plurality of SRAM cells coupled to the memory inputs, each of the SRAM cells storing one of the input data values to be written into a respective one of the non-volatile cells.

8. The write/verify circuit of claim 7, wherein the write mechanism comprises:

a plurality of bit latches configured to latch the processor data values prior to their being written into the non-volatile cells, each bit latch having an output to output the latch processor data values; and a plurality of bit line switches, having inputs coupled to the outputs of the bit latches, configured to pass latched outputs set to the first data value to inputs of the non-volatile cells upon assertion of a bit line control signal.

9. The write/verify circuit of claim 8, wherein the bit latch comprises:

first and second level-shifting inverters coupled end to end, each inverter having an input and an output, the input of the first inverter and the output of the second inverter being coupled to a respective processor data value input, each of the inverters being configured to invert a Vcc level processor data value to a ground level latched output and a GND level processor data value to a Vcc+ level latched output, the first and second inverters generating a latched output; and an output switch with a gate and drain respectively coupled to the latched output and the input of the bit line switch and a source and body coupled to a Vcc+ node, such that the output switch outputs the Vcc+ level latched output to the bit line switch when the latched output is at the GND level and otherwise turns off.

10. The write/verify circuit of claim 9, wherein:

the bit line switch comprises an n-channel transistor with drain, gate and source coupled respectively to the source of the output switch, the bit line control signal and the input of the non-volatile cell; and the bit line control signal, when asserted, is set to at least the Vcc+ level.

11. The write/verify circuit of claim 7, wherein the processing unit includes a combination of not more than three NAND gates and an inverter for each of the sense amplifier outputs, each of the combinations being arranged to compute a logical expression: PU(i)=NOT D(i) AND (SO(i) OR (NOT PV)), wherein D(i) is the ith input data value, SO(i) is the ith sense amplifier output data value and PV is a logical control input, such that an $i^{th}$ processor data value is at least in part a function of PU(i).

12. The write/verify circuitry of claim 11, wherein the input D[i] is derived from a respective one of the SRAM cells.

13. Write/verify circuitry for use in a non-volatile electrically erasable semiconductor memory device capable of operating in read, write and erase modes, comprising a multiplicity of storage sectors, each sector comprising a multiplicity of non-volatile cells, each of the cells comprising a MOS transistor having a turn-on threshold voltage Vt, the cells being arranged in columns, each of the columns being controlled by a bit line, the circuitry comprising:

a multiplicity of N sense amplifiers, each sense amplifier having an output;

a first set of M switches;

a multiplicity of M bit latches, each connected to a switch from the first set of switches;

a second set of M switches, an input of each switch connected to a bit latch of the multiplicity of bit latches and an output of each switch connected to one of the bit lines;

a processing unit for comparing N outputs of the sense amplifiers to N data inputs to be written into respective ones of the non-volatile cells; the processing unit having outputs at which comparison results are output;

a first multiplexer for connecting any subset of the first set of switches to the outputs of the processing unit; and a second multiplexer for connecting any subset of the bit lines to the multiplicity of N sense amplifiers.

14. The write/verify circuitry of claim 13, wherein each of the bit latches comprises:

first and second level-shifting inverters coupled end to end, each inverter having an input and an output, the input of the first inverter and the output of the second inverter being coupled to a respective processing unit output, each of the inverters being configured to invert a Vcc level processing unit output to a ground level latched output and a GND level processing unit output to a Vcc+ level latched output, the first and second inverters generating a latched output; and an output switch with a gate and drain respectively coupled to the latched output and the input of a respective one of the second set of switches and a source and body coupled to a Vcc+ node, such that the output switch outputs the Vcc+ level latched output to the bit line switch when the latched output is at the GND level and otherwise turns off.

15. The write/verify circuitry of claim 13 wherein the number N of data lines can be any positive integer representing the width of a data path.

16. The write/verify circuitry of claim 13 wherein M is $2^j$, where j is any positive integer.

17. The write/verify circuitry of claim 13 wherein the processing unit includes a combination of not more than three NAND gates and an inverter for each of the multiplicity of N sense amplifier outputs, each of the combinations being arranged to compute a logical expression: PU(i)= NOT D(i) AND (SO(i) OR (NOT PV)), wherein D(i) is an $i^{th}$ data input SO(i) an $i^{th}$ sense amplifier output and PV a logical control input, such that an $i^{th}$ processing unit output is at least in part a function of PU(i).

18. The write/verify circuitry of claim 17, wherein the $i^{th}$ processing unit output comprises a BO(i) signal that is a logical inversion of the PU(i) signal, the BO(i) signal being coupled to the input of the first multiplexer.

19. The write/verify circuitry of claim 13 wherein the processing unit includes a combination of NOR gates arranged to compute a logical expression:

PUSUM=PU(0) OR PU(1) OR ... PU(14) OR PU(15).

20. The write/verify circuitry of claim 13, further comprising a plurality of SRAM cells coupled to inputs of the processing unit, each of the SRAM cells storing one of the N data inputs to be written into a respective one of the non-volatile cells.

21. The write/verify circuitry of claim 20, wherein the bit latch comprises:

first and second level-shifting inverters coupled end to end, each inverter having an input and an output, the input of the first inverter and the output of the second inverter being coupled to a respective processor data value input, each of the inverters being configured to invert a Vcc level processor data value to a ground level latched output and a GND level processor data value to a Vcc+level latched output, the first and second inverters generating a latched output; and an output switch with a gate and drain respectively coupled to the latched output and the input of a respective one of the second set of switches and a source and body coupled to a Vcc+ node, such that the output switch outputs the Vcc+ level latched output to the bit line switch when the latched output is at the GND level and otherwise turns off.

22. The write/verify circuitry of claim 20, wherein:

each of the second set of switches comprises an n-channel transistor with drain, gate and source coupled respectively to the source of the output switch, the bit line control signal and the input of the non-volatile cell; and the bit line control signal, when asserted, is set to at least the Vcc+ level.

23. The write/verify circuitry of claim 20, wherein the processing unit includes a combination of not more than three NAND gates and an inverter for each of the sense amplifier outputs, each of the combinations being arranged to compute a logical expression: PU(i)=NOT D(i) AND (SO(i) OR (NOT PV)), wherein D(i) is an ith data input SO(i) an $i^{th}$ sense amplifier output and PV a logical control input, such that an $i^{th}$ processing unit output is at least in part a function of PU(i).

24. The write/verify circuitry of claim 23, wherein the input D[i] is derived from a respective one of the SRAM cells.

25. A write/verify method for use in a non-volatile electrically erasable semiconductor memory device comprising a multiplicity of data inputs and a multiplicity of storage sectors; each sector comprising a multiplicity of cells, each cell comprising a MOS transistor having a turn-on threshold voltage Vt, the cells being arranged in columns each column being controlled by a bit line, each bit line being connected to a bit latch, the method of operation comprising the steps of:

(1) loading a multiplicity of data bits into the bit latches;

(2) transferring the data bits to a subset of the memory cells;

(3) sensing the contents of the memory cells;

(4) comparing the contents of the memory cells to the data bits, each cell content being compared to the corresponding data bit in the random access memory cells; and (5) repeating the steps (1)–(4) until a match between all the data bits and all the sensed contents of the memory cells is obtained.

26. The method of claim 25 wherein the writing process is applied exclusively to cells where a match between the cell content and the data bit is not obtained.

* * * * *